(12) United States Patent
Hachitani et al.

(10) Patent No.: US 10,295,632 B2
(45) Date of Patent: May 21, 2019

(54) APPARATUS AND METHOD FOR PROCESSING RECEPTION SIGNAL IN MAGNETIC RESONANCE MEASUREMENT APPARATUS

(71) Applicant: JEOL Ltd., Tokyo (JP)

(72) Inventors: Kenichi Hachitani, Tokyo (JP); Takeshi Tsukada, Tokyo (JP); Tetsuro Sugita, Tokyo (JP); Takayuki Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 937 days.

(21) Appl. No.: 14/805,731

(22) Filed: Jul. 22, 2015

(65) Prior Publication Data
US 2016/0187441 A1    Jun. 30, 2016

(30) Foreign Application Priority Data

Jul. 23, 2014    (JP) .................... 2014-149863

(51) Int. Cl.
*G01R 33/46* (2006.01)
*G01R 33/36* (2006.01)

(52) U.S. Cl.
CPC ......... *G01R 33/4625* (2013.01); *G01R 33/36* (2013.01); *G01R 33/3621* (2013.01)

(58) Field of Classification Search
CPC .... G01R 33/36–33/3692; G01R 33/46–33/586
See application file for complete search history.

(56) References Cited

U.S. PATENT DOCUMENTS

| 6,249,360 B1* | 6/2001 | Pollard | H04N 1/047 |
| | | | 358/473 |
| 6,400,152 B1* | 6/2002 | Cline | G01R 33/446 |
| | | | 324/309 |
| 7,248,635 B1* | 7/2007 | Arneson | H04L 25/0278 |
| | | | 333/155 |

(Continued)

FOREIGN PATENT DOCUMENTS

| CN | 102103195 A | 6/2011 |
| GB | 2290875 A | 1/1996 |

(Continued)

OTHER PUBLICATIONS

Giovannetti et al, "Application of Undersampling Technique for the Design of an NMR Signals Digital Receiver", Concepts in Magnetic Resonance Part B, XP-002750888, Aug. 2006, pp. 107-114, vol. 29B, No. 3.

*Primary Examiner* — Huy Q Phan
*Assistant Examiner* — David B Frederiksen
(74) *Attorney, Agent, or Firm* — The Webb Law Firm

(57) ABSTRACT

In a magnetic resonance measurement apparatus such as an NMR measurement apparatus, when a frequency of an observation nucleus falls within a high frequency band, an RF reception signal is converted into an intermediate frequency signal, and is input to an analog-to-digital converter. In this case, under-sampling is executed for the intermediate frequency signal in the analog-to-digital converter, and a second-order aliased signal component generated from a target signal component is observed. On the other hand, when the frequency of the observation nucleus falls within a low frequency band, over-sampling for the RF reception signal is executed.

7 Claims, 6 Drawing Sheets

(56) References Cited

U.S. PATENT DOCUMENTS

| | | | | |
|---|---|---|---|---|
| 9,029,791 B1* | 5/2015 | Kovalski | ............... | A61B 6/037 250/369 |
| 2005/0057381 A1* | 3/2005 | Fletcher | ............... | H03B 29/00 341/131 |
| 2006/0256464 A1* | 11/2006 | Ozdemir | ............... | G11B 5/09 360/46 |
| 2008/0021303 A1* | 1/2008 | Krueger | ............ | G01R 33/5615 600/410 |
| 2009/0047026 A1* | 2/2009 | Luo | ....................... | H04B 10/40 398/135 |
| 2011/0109310 A1 | 5/2011 | Hornung | | |
| 2012/0212360 A1* | 8/2012 | Kanter | ............... | H03M 1/1245 341/120 |

FOREIGN PATENT DOCUMENTS

| | | | |
|---|---|---|---|
| JP | 698874 | A | 4/1994 |
| JP | 06098874 | A * | 4/1994 |
| JP | 2010139316 | A | 6/2010 |
| JP | 2011102804 | A | 5/2011 |
| WO | 2011073880 | A1 | 6/2011 |

* cited by examiner

| | 110 | 112 | 114 | 116 | 118 |
|---|---|---|---|---|---|
| | RF | ORIGINAL SIGNAL/SAMPLING TARGET | TRANSMISSION SIDE ROUTE SELECTION | RECEPTION SIDE ROUTE SELECTION | SAMPLING SCHEME |
| 120 | GREATER THAN OR EQUAL TO 5 MHz AND LESS THAN 50 MHz | RF SIGNAL (GREATER THAN OR EQUAL TO 5 MHz AND LESS THAN 50 MHz) | MIXER BYPASS | MIXER BYPASS | OVER-SAMPLING (100 MHz) |
| 122 | GREATER THAN OR EQUAL TO 50 MHz AND LESS THAN OR EQUAL TO 1000 MHz | IF SIGNAL (125 MHz FOR OBSERVATION NUCLEUS) | MIXER PASS | MIXER PASS | UNDER-SAMPLING (100 MHz) |

FIG. 4

APPARATUS AND METHOD FOR
PROCESSING RECEPTION SIGNAL IN
MAGNETIC RESONANCE MEASUREMENT
APPARATUS

CROSS REFERENCE TO RELATED
APPLICATIONS

This application claims priority to Japanese Patent Application No. 2014-149863 filed on Jul. 23, 2014, which is incorporated herein by reference in its entirety.

BACKGROUND OF THE INVENTION

Field of the Invention

The present invention relates to a magnetic resonance measurement apparatus, and in particular to a technique for sampling a reception signal.

Description of Related Art

As magnetic resonance measurement apparatuses, nuclear magnetic resonance (NMR) measurement apparatuses and electron spin resonance (ESR) measurement apparatuses are known. In addition, as apparatuses classified as NMR measurement apparatuses, magnetic resonance imaging (MRI) apparatuses are also known. In the following, NMR measurement apparatuses will be described.

NMR refers to a phenomenon where an atomic nucleus under a static magnetic field interacts with an electromagnetic wave having a frequency intrinsic to the atomic nucleus. An apparatus that executes measurement of a sample at an atomic level taking advantage of this phenomenon is an NMR measurement apparatus. Currently, NMR measurement apparatuses are used in analyses of organic compounds (for example, medicines and agricultural chemicals), polymer materials (for example, vinyl and polyethylene), biological substances (for example, nucleic acids and proteins), or the like. With the use of an NMR measurement apparatus, for example, a molecular structure of the sample can be revealed.

An NMR measurement apparatus generally includes a control computer, a radio frequency (RF) signal transmitter, an NMR signal detector (probe), a static magnetic field generator (superconductive magnet), an NMR signal receiver, and the like. In some cases, a part of these structures is called an NMR measurement apparatus. For example, a part of a spectrometer including the control computer, the RF signal transmitter, and the NMR signal receiver may be called an NMR measurement apparatus. In a typical NMR measurement, a high-frequency signal for NMR measurement (RF transmission signal) is generated in the transmitter, and the transmission signal is supplied to a transmission and reception coil in the probe. A resonance absorption phenomenon is caused in an observation nucleus in the sample due to an electromagnetic wave caused by the transmission signal. An NMR signal induced in the transmission and reception coil (RF reception signal) is then transmitted to the receiver, and a spectrum of the received signal is analyzed.

In general, in sampling of the reception signal, the sampling must be executed at a frequency of greater than or equal to twice the frequency of the reception signal (Nyquist's theorem). In an NMR measurement apparatus, if the sampling is to be executed by an ADC (analog-to-digital (A/D) converter) for a reception signal of a few hundred of MHz, the sampling must be executed at a very high frequency. Such an A/D converter that operates at a high frequency is in general difficult to obtain, and, even if such an A/D converter is available, the A/D converter would be very expensive, and in many cases, does not have a sufficient resolution. On the other hand, the observation frequency is known in the NMR measurement. Under such circumstances, in some of the NMR measurement apparatuses, an under-sampling technique is utilized (refer to JP H6-98874 A, JP 2010-139316 A, and JP 2011-102804 A). In these techniques, sampling is executed at a frequency lower than twice the frequency of the signal to be processed (in particular, at a lower frequency than the frequency of the signal to be processed), and a mirror signal component which is caused by a target signal component being aliased or folded is observed. For example, in the NMR measurement apparatus of related art disclosed in JP H6-98874 A, an eighth-order aliased signal component is observed. On the other hand, when the transmission and reception are executed at a relatively low RF frequency (for example, when the RF frequency is less than half of the sampling frequency), over-sampling is possible, and is appropriate.

In the NMR measurement apparatuses of related art disclosed in JP H6-98874 A, JP 2010-139316 A, and JP 2011-102804 A, the over-sampling and under-sampling are not switched. Thus, it has not been possible to selectively use an appropriate sampling scheme according to the situation. This problem may also occur in magnetic resonance measurement apparatuses other than the NMR measurement apparatuses.

SUMMARY OF THE INVENTION

An advantage of the present invention is that, in a magnetic resonance measurement apparatus, a sampling scheme suitable for a circumstance can be selected from among a plurality of sampling schemes. Another advantage of the present invention is that, in both the case where the signal is converted into an IF (intermediate frequency) signal and the case where the signal is not converted into the IF signal, a suitable sampling can be executed.

According to one aspect of the present invention, there is provided a magnetic resonance measurement apparatus comprising: an analog-to-digital converter circuit to which an analog reception signal including a target signal component having a first frequency is input, that samples the analog reception signal at a sampling frequency which is a second frequency, and that outputs a digital reception signal; and a signal processor circuit that executes a signal processing on the digital reception signal, wherein when the first frequency satisfies an over-sampling condition, a sampling scheme of the analog-to-digital converter circuit is an over-sampling scheme, and the signal processor circuit executes the signal processing on the target signal component, and when the first frequency satisfies an under-sampling condition, the sampling scheme of the analog-to-digital converter circuit is an under-sampling scheme, and the signal processor circuit executes the signal processing on an aliased signal component generated from the target signal component.

According to the above-described configuration, the analog reception signal is sampled at the sampling frequency in the A/D converter circuit, and the digital reception signal is generated. The signal processing is executed on the digital reception signal. When the first frequency satisfies the over-sampling condition, the sampling scheme in the A/D converter circuit becomes the over-sampling scheme and the signal processor circuit observes the target signal component itself. On the other hand, when the first frequency satisfies the under-sampling condition; that is, when the over-sampling is not possible, the sampling scheme at the A/D converter circuit becomes the under-sampling scheme, and the signal processor circuit observes the aliased signal component (mirror component) in place of the target signal component. The observation nucleus (and, consequently, the observation frequency) is known, and the first frequency is known, and thus, the frequency in which the aliased signal component occurs is also known. Therefore, the aliased signal component of interest can be easily identified. The over-sampling condition and the under-sampling condition are frequency conditions, and are determined in relation to the second frequency (sampling frequency).

As described, a suitable sampling scheme is selected according to the first frequency. In the switching of the sampling scheme, it is not necessary to change the frequency of the sampling clock supplied to the A/D converter circuit (second frequency), and the operation condition of the A/D converter circuit does not need to be changed. The sampling scheme is changed according to the first frequency. In other words, the sampling scheme is naturally switched by manipulating the first frequency. For example, the first frequency can be manipulated by selecting whether or not a frequency conversion is to be executed upstream of the A/D converter circuit. When the frequency conversion is not executed, the analog reception signal which is input to the converter circuit would be the RF reception signal. In this case, the frequency determined according to the observation nucleus (observation frequency) is the first frequency. On the other hand, when the frequency conversion is executed, the analog reception signal which is input to the converter circuit would be, for example, an intermediate frequency signal having a fixed intermediate frequency. In this case, the intermediate frequency is the first frequency. As the above-described signal processing, a filter process, a decimation process, an FFT calculation, or the like may be exemplified. It is also possible to switch the sampling frequency and the other conditions, along with the switching of the sampling scheme.

According to another aspect of the present invention, preferably, a frequency converter circuit is provided upstream of the analog-to-digital converter circuit, the frequency converter circuit converts an RF reception signal into an intermediate frequency signal when a frequency determined according to the observation nucleus falls within a high frequency band, and does not convert the RF reception signal into the intermediate frequency signal and outputs the RF reception signal when the frequency determined according to the observation nucleus falls within a low frequency band which is lower than the high frequency band, the RF reception signal or the intermediate frequency signal is input to the analog-to-digital converter circuit as the analog reception signal, the first frequency satisfies the over-sampling condition when the first frequency is the frequency determined according to the observation nucleus and the RF reception signal is input to the analog-to-digital converter circuit, and the first frequency satisfies the under-sampling condition when the first frequency is the intermediate frequency and the intermediate frequency signal is input to the analog-to-digital converter circuit.

According to the above-described configuration, a determination is made as to whether or not the frequency conversion is to be executed depending on whether the frequency determined according to the observation nucleus (observation frequency) falls within the high frequency band or the low frequency band, and the sampling scheme of the A/D converter circuit is determined in a linked manner therewith. When the frequency conversion is not executed, the observation frequency is the first frequency. This frequency is a frequency that changes within the low frequency band. When the frequency conversion is executed, the intermediate frequency is the first frequency, and is a frequency which is basically fixed.

According to another aspect of the present invention, preferably, the frequency converter circuit comprises: a mixer that mixes a local signal to the RF reception signal; and a filter provided downstream of the mixer, and that suppresses a signal component, in an output signal of the mixer, existing in a band other than the band within which the intermediate frequency falls, and the intermediate frequency signal is output from the filter. With the filter, unnecessary signal components existing in bands other than the band within which the first frequency falls can be suppressed, and the aliased signal component can be observed with a high level of precision.

According to another aspect of the present invention, preferably, the first frequency satisfies the over-sampling condition when the first frequency is lower than a reference frequency which is less than or equal to ½ the second frequency, and the first frequency satisfies the under-sampling condition when the first frequency is greater than or equal to the reference frequency. For example, when the second frequency (sampling frequency) is 100 MHz, a frequency of ½ the second frequency is 50 MHz, and, in this case, for example, 50 MHz is determined as the reference frequency. Alternatively, the reference frequency may be a frequency lower than this frequency. When the frequency determined according to the observation nucleus is lower than the reference frequency, the over-sampling scheme can be applied, and thus, is selected. When the over-sampling scheme cannot be applied, the under-sampling scheme is applied.

According to another aspect of the present invention, preferably, when the first frequency satisfies the under-sampling condition, the signal processor circuit executes the signal processing on a second-order aliased signal component generated from the target signal component. According to such a configuration, the target signal component can be processed without applying spectrum inversion or the like. Alternatively, another even-order aliased signal component may be observed.

BRIEF DESCRIPTION OF THE DRAWINGS

FIG. 4 is a diagram for explaining change of an operation condition according to a frequency of an observation nucleus.

DESCRIPTION OF THE INVENTION

A preferred embodiment of the present invention will now be described with reference to the drawings.

(1) NMR Measurement Apparatus

Figure 1:
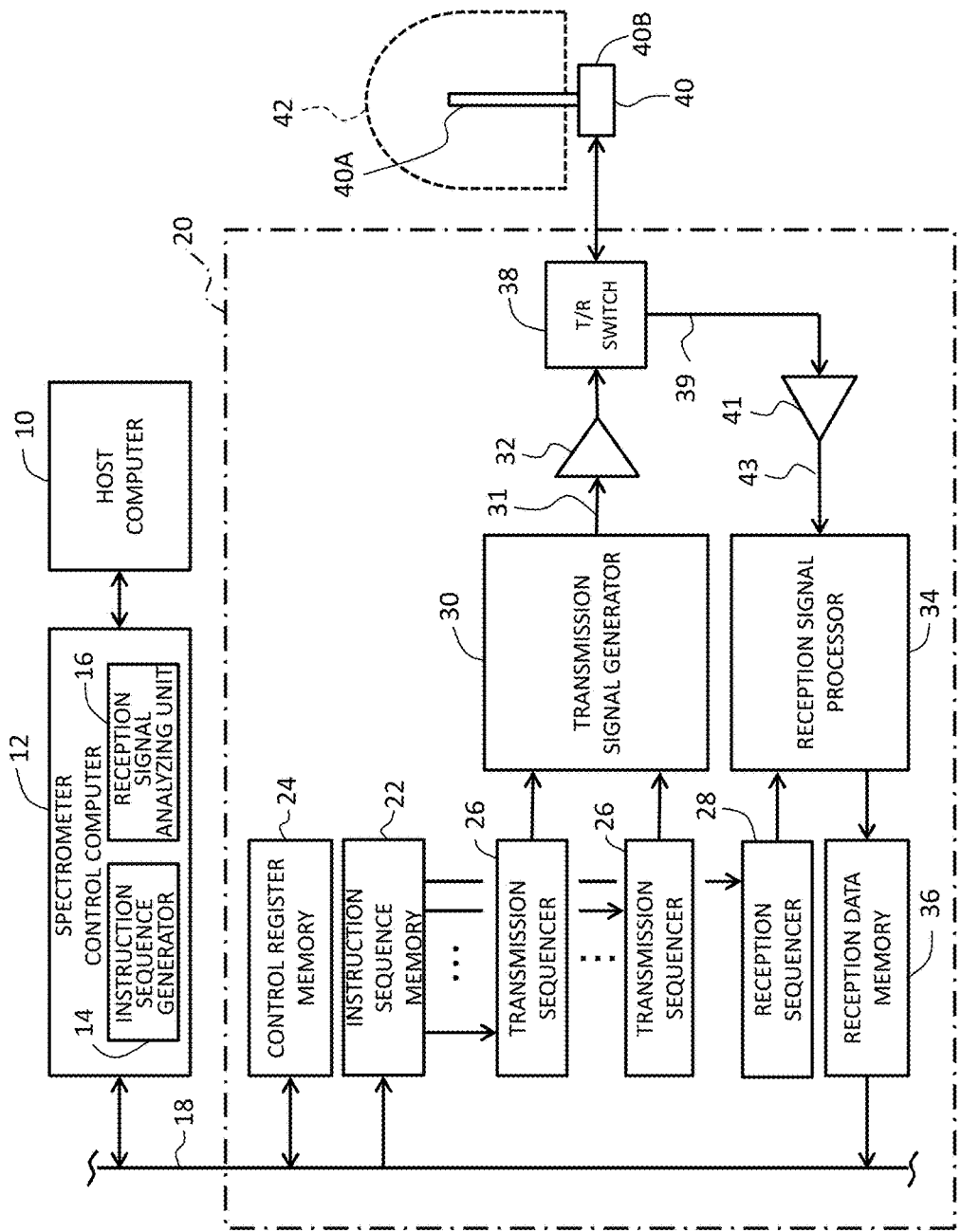
FIG. 1 is a block diagram showing an NMR measurement apparatus according to a preferred embodiment of the present invention.

FIG. 1 shows a preferred embodiment of an NMR measurement apparatus according to the present invention. The NMR measurement apparatus is used for analysis of organic compounds, polymer materials, biological substances, and other substances. A sample to be measured is liquid, solid, or the like. The present invention also can be applied to other magnetic resonance measurement apparatuses.

In FIG. 1, a host computer 10 generates a pulse program. The pulse program is a program describing a pulse sequence for realizing a desired NMR measurement, and is generated by a user or automatically. The pulse program is sent from the host computer 10 to a spectrometer control computer 12. The host computer 10 may be formed by a typical personal computer.

The spectrometer control computer 12 controls an operation of a transmission and reception unit 20 which will be described in detail later, and analyzes reception data obtained from the transmission and reception unit 20. The spectrometer control computer 12 and the transmission and reception unit 20 form a spectrometer. In the present embodiment, the spectrometer control computer 12 is equipped with an instruction sequence generator 14 that converts the pulse program into a sequence of instructions (instruction sequence). The instruction sequence generator 14 is formed, for example, as a compiler. In the present embodiment, the instruction sequence generator 14 generates a sequence of instructions for controlling the transmission and reception unit 20, and the sequence of instructions is sent to the transmission and reception unit 20. Alternatively, the pulse program may be sent to the transmission and reception unit 20 and the transmission and reception unit 20 may interpret the pulse program to generate the instruction sequence. Alternatively, the spectrometer control computer 12 may generate a compressed, intermediate instruction sequence and transfer the instruction sequence to the transmission and reception unit 20, and the transmission and reception unit 20 may decompress the intermediate instruction sequence, to re-construct an uncompressed instruction sequence. In particular, when a transfer rate (amount of data) during transfer is problematic, the transfer of the compressed intermediate instruction sequence as described above is desirable.

The spectrometer control computer 12 is connected to the transmission and reception unit 20 via a communication bus 18. In the example configuration shown in the drawings, the spectrometer control computer 12 is connected to the host computer 10 via a network. The spectrometer control computer 12 is formed, for example, by a dedicated or general-purpose computer. In the present embodiment, the spectrometer control computer 12 is equipped with an FFT (fast Fourier transform) calculation function for analyzing the spectrum of the reception signal. This function is shown in FIG. 1 as a reception signal analyzing unit 16. The spectrometer control computer 12 is equipped with, in addition to the spectrum analyzing function, a control function, and an administrative function necessary for the NMR measurement. Alternatively, the host computer 10 and the spectrometer control computer 12 may be integrated. Alternatively, a plurality of the spectrometer control computers 12 may be employed. Further alternatively, a part or all of the functions of the spectrometer control computer 12 described above may be equipped in the host computer 10.

The transmission and reception unit 20 will now be described. The transmission and reception unit 20 generates a transmission signal which is necessary for the NMR measurement, and processes a reception signal which represents a result of the NMR measurement. Alternatively, the transmission and reception unit 20, or a part in which the transmission and reception unit 20 and the spectrometer control computer 12 are combined (spectrometer), may be called the NMR measurement apparatus.

An instruction sequence memory 22 stores, in the present embodiment, the sequence of instructions sent from the spectrometer control computer 12. For example, when the sequence of instructions is converted to the intermediate instruction sequence described above, a calculation processor (not shown) generates (re-constructs) the final instruction sequence from the intermediate instruction sequence. Alternatively, the sequence of instructions may be generated by another circuit. In the instruction sequence memory 22, a plurality of storage areas which store the sequence of instructions in units of sequencers (to be described below) are provided. Alternatively, the storage areas may be provided inside each sequencer. The sequence of instructions includes various instructions, including a dynamic setting parameter to be given to an individual dynamic circuit (for example, a suppression level which is set for the dynamic variable attenuator to be described later).

In the present embodiment, in addition to the instruction sequence memory 22, a control register memory 24 is provided. In the control register memory 24, a register area is set, and a static setting parameter to be given to an individual static circuit is written in the register area. Similar to the sequence of instructions, the setting parameter is generated based on the pulse program. The writing of the static setting parameter to the register area is executed by the spectrometer control computer 12. For example, a controller (not shown) may read each static setting parameter from the register area and set the same in each static circuit. Alternatively, an individual static circuit may acquire the static setting parameter from the register area on its own.

In the present disclosure, "static" generally means that an operation condition of the circuit (static circuit) is determined before start of execution of the measurement, and "dynamic" generally means that the operation condition of the circuit (dynamic circuit) is determined during the measurement (that is, the operation condition is changed). In other words, for the static circuit, a necessary setting parameter is given before the start of the measurement, and the setting parameter is maintained during the measurement. For the dynamic circuit, a control is applied to update the setting parameter at a necessary timing (precise moment) during the measurement. With such a configuration, the operation condition of the dynamic circuit is dynamically varied.

A plurality of transmission sequencers 26 control the operations of the plurality of transmission signal generators or of a transmission signal generator (transmitter) 30. More specifically, each individual transmission sequencer 26 sequentially executes the sequence of instructions prepared for the transmission sequencer 26 from the beginning. In the present embodiment, four transmission signal generators (four signal generators (FIG. 2)) are provided, and, correspondingly, four transmission sequencers 26 are provided. Specifically, a first transmission sequencer controls a first signal generator, a second transmission sequencer controls a second signal generator, a third transmission sequencer controls a third signal generator, and a fourth transmission sequencer controls a fourth signal generator. However, the one-to-one correspondence relationship is not a requirement, and alternatively, one transmission sequencer may control a plurality of signal generators or a plurality of transmission sequencers may control one signal generator. The control of the operations of h circuit that combines the plurality of the transmission signals (a combiner shown in FIG. 2 and described later) and operations of circuits provided downstream thereof (circuits downstream of the combiner shown in FIG. 2 and described later) is executed by a part or all of the four transmission sequencers. So long as each dynamic circuit can execute a suitable operation at a suitable timing according to the sequence of instructions generated from the pulse program, various structures may be employed for the sequencer or the local controller. The numerical values explicitly described in the present disclosure are given only as exemplary values.

A reception sequencer 28 basically has the same structure as an individual transmission sequencer 26; and sequentially executes the sequence of instructions prepared for the reception sequencer 28 from the beginning. With such a configuration, the operation of each dynamic circuit of a reception signal processor (receiver) 34 is controlled. According to the present embodiment, the reception circuit can also be controlled dynamically. For example, as will be described later, a frequency modulation and a phase modulation can be applied to a pair of reference signals used in quadrature detection, and, moreover, the modulation conditions can be dynamically changed during the measurement. In the present embodiment, only a single reception sequencer 28 is exemplified, but alternatively, the reception signal processor 34 may be controlled by a plurality of reception sequencers. Alternatively, a sequencer which integrally manages the control timings or the like of one or more transmission sequencers and one or more reception sequencers may be provided separately.

The transmission signal generator 30 includes a plurality of signal generators serving as the plurality of transmission signal generators, an adder serving as the combiner, a D/A converter (DAC), a signal processor circuit, a frequency converter circuit, or the like. A specific example structure thereof will be described later with reference to FIG. 2. The transmission signal generator 30 generates an RF transmission signal 31 for NMR measurement. The RF transmission signal 31 is an analog signal, and is transmitted to a power amplifier 32 that executes amplification. The RF transmission signal amplified by the power amplifier 32 is transmitted to a probe 40 via a T/R switch (transmission and reception switch) 38.

The probe 40 includes an insertion section 40A having a transmission and reception coil (not shown), and a housing section 40B corresponding to a root portion of the insertion section 40A. In the example configuration shown in the drawings, the probe has one port, and thus one RF transmission signal is input to the probe. Alternatively, a probe having two or more ports may be used. The insertion section 40A has a cylindrical shape, and is inserted into a bore (cylindrical cavity) of a static magnetic field generator 42. When the RF transmission signal is supplied to the transmission and reception coil, an electromagnetic wave generated in the coil is irradiated onto the sample, and a resonance absorption phenomenon occurs at the observation nucleus of the sample. Then, the NMR signal induced in the transmission and reception coil (RF reception signal) is transmitted from the probe 40 to the reception signal processor 34 via the T/R switch 38.

In the present embodiment, the T/R switch 38 has a routing function to transmit the RF transmission signal to the probe during the transmission and to transmit the RF reception signal from the probe to the reception signal processor 34 during reception. A reception signal 39 from the T/R switch 38 is amplified by a pre-amplifier 41, and an amplified reception signal 43 is transmitted to the reception signal processor 34. Alternatively, the pre-amplifier 41 may be built in the T/R switch 38.

The reception signal processor 34 in the transmission and reception unit 20 is a circuit which executes processes such as the frequency conversion, the A/D (analog-to-digital) conversion, the quadrature detection, or the like on the input RF reception signal. A specific example structure will be described later with reference to FIG. 3. The processed reception signal (complex signal) is temporarily stored in reception data memory 36 as reception data. The reception data which is read from the reception data memory 36 is transmitted to the spectrometer control computer 12, and the analysis of the reception data is executed therein. Alternatively, the reception data may be analyzed in the transmission and reception unit 20.

(2) Transmission Signal Generator

Figure 2:
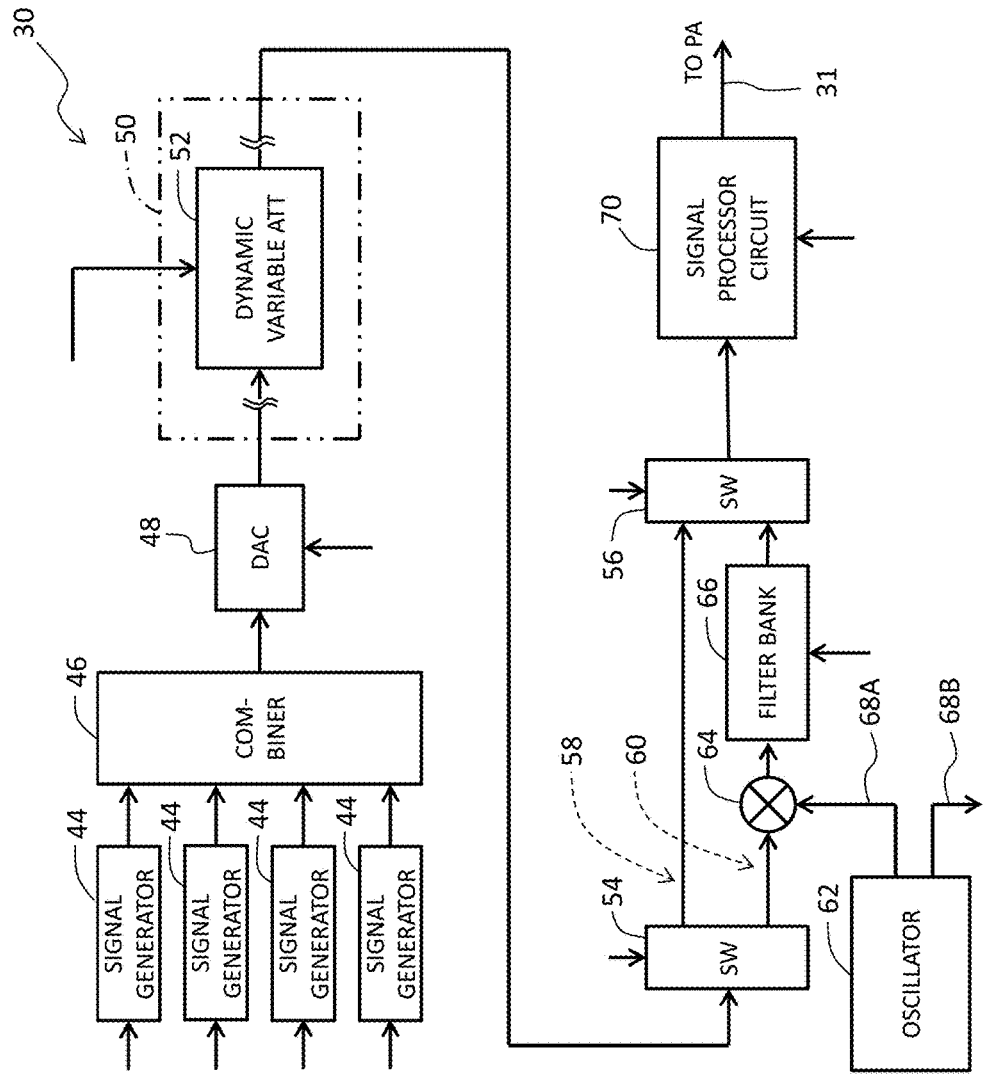
FIG. 2 is a block diagram showing an example structure of a transmission signal generator.

Next, a specific example structure of the transmission signal generator 30 will be described with reference to FIG. 2. In FIG. 2, four signal generators 44 generate a maximum of four transmission signals. The operations of four signal generators 44 are basically controlled by four transmission sequencers. Specifically, a parameter set which defines the operation of each signal generator 44 is provided from each transmission sequencer to each signal generator 44. In the present embodiment, each signal generator 44 includes an NCO (Numerical Controlled Oscillator). The NCO includes a phase accumulator, a sine wave lookup table, or the like. Using the NCO, the frequency modulation, the phase modulation, and the amplitude modulation can be executed. In other words, in each signal generator 44, a transmission signal (original signal) to which the modulation process or the like is applied is generated independently from each other. The frequency of the signal generated in the NCO can be freely determined.

In the present embodiment, the frequency of the transmission signal generated by the signal generator 44 can be arbitrarily selected from, for example, a range of 5-200 MHz. As will be described below, when the frequency of the observation nucleus (frequency of the RF signal) falls within a low frequency band of, for example, greater than or equal to 5 MHz and less than 50 MHz, the frequency of the generated transmission signal (original frequency) is set as the frequency of the RF transmission signal. On the other hand, when the frequency of the observation nucleus falls within a high frequency band of, for example, greater than or equal to 50 MHz and less than or equal to 1000 MHz, a frequency of 125 MHz, for example, is selected as the frequency of the generated transmission signal (original frequency), and is set as an intermediate frequency. The final RF transmission signal is then generated by a frequency conversion with respect to the intermediate frequency signal.

A combiner 46 is a circuit which combines (for example, adds) the plurality of transmission signals (digital signals) generated by the plurality of signal generators 44, to generate a digital combined signal. There is a case where, in reality, only one transmission signal is generated in a group of signal generators, but in many cases, a plurality of transmission signals are generated. For the purpose of this disclosure, an output signal of the combiner 46 will be described as a digital combined signal. The digital combined signal is transmitted to a DAC (D/A converter) 48. A sampling clock of, for example, 800 MHz, is input to the DAC 48, and the digital combined signal is converted into an analog combined signal in the DAC 48. A filter, an amplifier, and other circuits provided downstream of the DAC 48 are omitted in the drawings.

A signal processor circuit 50 is provided downstream of the DAC 48, and includes a dynamic variable ATT (attenuator) 52. The dynamic variable ATT 52 is dynamically controlled by any of the sequencers during the measurement. Specifically, by the action of the dynamic variable ATT 52, the suppression level for the pulse train can be dynamically varied during the measurement. For example, when the analog combined signal which is input to the dynamic variable ATT 52 includes a rectangular pulse of a large amplitude (hard pulse) and a subsequent mountain-shaped pulse of a large amplitude (soft pulse), if the suppression level is set large immediately after the preceding rectangular pulse; for example, if the suppression level is changed from 0 dB to −60 dB, the overall amplitude of the succeeding mountain-shaped pulse can be suppressed while maintaining the amplitude and the waveform of the preceding rectangular pulse. With such a configuration, for example, a pulse sequence as designed, in which a difference in level (difference in amplitude intensity) is provided between the rectangular pulse and the shaped pulse can be realized afterwards. The step of the suppression level of the dynamic variable ATT 52 is, for example, 1 dB.

The dynamic variable ATT 52 is made of, for example, a plurality of ATT elements, and one or more ATT elements are selected from the plurality of ATT elements or a combination thereof is selected, to realize a desired suppression level. While it is desirable to employ a structure that can realize suppression levels of multiple stages, it is also possible to use a dynamic variable ATT having suppression levels of two stages. Alternatively, an apparatus in which the suppression level can be continuously varied may be used as the dynamic variable ATT. In either case, it is desirable to employ an apparatus having a superior responsiveness. In this process, the supply timing of the control signal to the dynamic variable ATT 52 may be adjusted in anticipation of the delay of the response.

In the present embodiment, the suppression level at the dynamic variable ATT 52 can be dynamically varied in units of individual pulse forming the analog combined signal, for example, in units of the transmission signals from the signal generators 44. Alternatively, a configuration may be employed in which the suppression level can be stepwise or continuously varied within one pulse period included in the analog combined signal. Alternatively, the dynamic variation of the suppression level may be applied to the pulse train which is output from one signal generator 44.

In the present embodiment, the dynamic variable ATT 52 is provided upstream of a frequency converter circuit to be described later (in particular, a mixer 64). With such a configuration, compared to a structure where the dynamic variable ATT 52 is provided downstream of the frequency converter circuit, the influence due to the frequency characteristic of the dynamic variable ATT 52 (in particular, phase shift) can be inhibited. Specifically, at the downstream of the frequency converter circuit, a variation range of the frequency of the RF transmission signal is very wide (in the present embodiment, greater than or equal to 50 MHz and less than or equal to 1000 MHz), and, if the dynamic variable AFT is provided there, the influence by the frequency characteristic of the dynamic variable ATT cannot be ignored, and the phase shift would be great or the phase would change in a complex manner during the dynamic change of the suppression level, for which correction is very difficult. On the other hand, when the dynamic variable ATT is provided upstream of the frequency converter circuit, the frequency of the IF signal passing therethrough is fixed (in the present embodiment, 125 MHz) or the frequency change width of the RF signal passing therethrough is relatively small (in the present embodiment, greater than or equal to 5 MHz and less than 50 MHz), and, consequently, even if there is an influence due to the frequency characteristic as described above, the influence would be relatively small and can be easily corrected.

A frequency converter circuit with a bypass route is provided downstream of the signal processor circuit 50. The frequency converter circuit specifically includes an input side SW (switch) 54, an output side SW 56, and a frequency conversion route 60 and a bypass route 58 provided between the SWs, or the like. On the frequency conversion route 60, the mixer 64 and a filter bank 66 are provided. In the mixer 64, a local signal 168A from an oscillator 62 is mixed into the analog combined signal which is input (in this case, an intermediate frequency signal), and an RF transmission signal is thus generated. In reality, an unnecessary frequency component caused in the mixing (for example, a mixer image corresponding to a sum frequency or a difference frequency) is removed by the filter bank 66, and the RF transmission signal is thus generated. The filter bank 66 includes, for example, a plurality of LPFs (low pass filters) or HPFs (high pass filters) that are provided in parallel to each other, and the LPF or HPF to be actually used is selected therefrom. A cutoff frequency of the filter is statically changed according to the RF frequency. Alternatively, in place of the LPF or the HPF, other filters such as a BPF (band pass filter) may be provided.

In the present embodiment, when the frequency of the observation nucleus falls within the low frequency band, a direct generation scheme; that is, a non-conversion scheme is selected, and, in this case, the input side SW 54 and the output side SW 56 select the bypass route 58. In other words, in this case, the mixer 64 and the filter bank 66 do not function. In this case, the analog combined signal which is the input signal of the frequency converter circuit is not the intermediate frequency signal, and is the RF transmission signal. That is, when the direct generation scheme is selected, the RF transmission signal is generated from the beginning at the plurality of signal generators 44.

On the other hand, when the frequency of the observation nucleus falls within the high frequency band, a frequency conversion scheme is selected, and in this case, the input side SW 54 and the output side SW 56 select the frequency conversion route 60. In other words, in this case, the mixer 64 and the filter bank 66 function. In this case, the analog combined signal, which is the input signal of the frequency converter circuit serves as the intermediate frequency signal, is mixed with the local signal 68A in the mixer 64, then passes through the filter bank 66, and becomes the RF transmission signal. In the above-described example configuration, the ranges for the low frequency band and the high frequency band can be suitably determined. The input side SW 54 and the output side SW 56 are static circuits, and the operations thereof are set before the start of the measurement. Alternatively, the SWs may be constructed as dynamic circuits, and the scheme may be switched during the measurement.

The oscillator 62 is a signal generator which generates the local signal 68A to be supplied to the mixer 64. A frequency of the local signal 68A is determined as a frequency necessary for the frequency conversion from the IF to the RF. The local signal generated in the oscillator 62 is also transmitted to the reception signal processor. This signal is shown with reference numeral 68B. By using the same signal, a transmission processing condition and a reception processing condition can be matched. In this case, it is desirable to match the signal route lengths.

A signal processor circuit 70 is a circuit provided downstream of the frequency converter circuit. The signal processor circuit 70 includes a static fixed ATT (attenuator) and a static variable ATT which can be operated as necessary. An attenuation value of the static fixed ATT is fixed. The attenuation value of the static variable ATT can be varied and set in intervals of predetermined units. The ATTs are static circuits, and the presence/absence of the operation (and the operation condition of the static ATT) is set prior to the start of the measurement. Because the static fixed ATT and the static variable ATT are circuits that are statically set, the phase shift or the like can be identified in advance. In addition, the phase shift or the like can be corrected in advance or afterwards. In the present embodiment, because the static fixed ATT and the static variable ATT are provided downstream of the frequency converter circuit; that is, at the final stage of the transmission signal generator, advantages can be obtained that, due to the suppression actions of the ATTs, the transmission signal which follows the pulse sequence can be generated and that the unnecessary signal generated in the generation process of the transmission signal or mixed noise can be suppressed.

The RF transmission signal 31 is generated by the transmission signal generator 30 in a manner as described above. The RF transmission signal 31 is amplified by the power amplifier 32 shown in FIG. 1, and the amplified RF transmission signal is output to the probe 42 via the T/R switch 38.

(3) Reception Signal Processor

Figure 3:
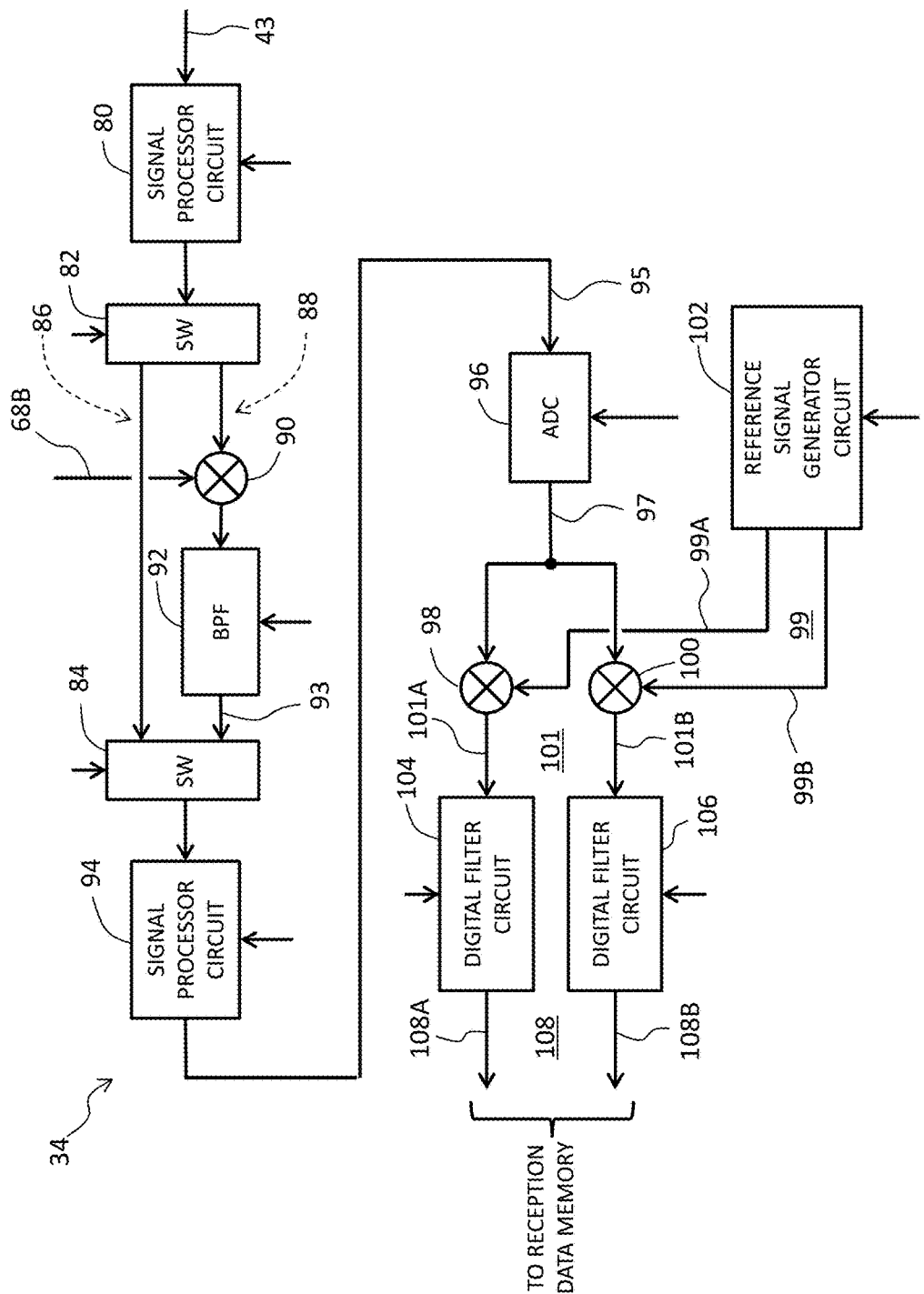
FIG. 3 is a block diagram showing an example structure of a reception signal processor.

Next, a specific example structure of the reception signal processor 34 will be described with reference to FIG. 3. The RF reception signal 43 amplified by the pre-amplifier 41 (FIG. 1) passes through a signal processor circuit 80 and is input to a frequency converter circuit with a bypass route. The signal processor circuit 80 has a fixed amplifier, a variable amplifier, a variable ATT, or the like. These circuits are static circuits. With the signal processor circuit 80, because the NMR signal can be amplified upstream of the frequency converter circuit; that is, at the first stage of the reception signal processor, advantages can be obtained in that the unnecessary signal generated in the reception process or the mixed noise can be reduced. However, so long as the necessary purity or the like for the reception signal can be maintained, the circuits may be changed to dynamic circuits.

The frequency converter circuit specifically includes an input side SW 82, an output side SW 84, and a frequency conversion route 88 and a bypass route 86 provided between the SWs, or the like. On the frequency conversion route 88, a mixer 90 and a BPF 92 are provided. These circuits are static circuits. In the mixer 90, the local signal 68B from the oscillator is mixed with the analog RF reception signal which is input, and, consequently, an intermediate frequency signal is generated. In reality, unnecessary frequency components generated in the mixing process are removed by the BPF 92, and an intermediate frequency signal 93 is thus generated. The BPF 92 has a function, in addition to removing the unnecessary signal components generated by the mixing process (for example, mixer image corresponding to a sum frequency or a difference frequency), as an anti-aliasing filter that suppresses the unnecessary signal in relation to under-sampling to be described later. In the present embodiment, a target signal (for example, 125 MHz) serving as the intermediate frequency signal appears in a third Nyquist zone (for example, 100-150 MHz with respect to 100 MHz sampling). On the frequency axis, the signal components (noise) existing in ranges other than the third Nyquist zone are removed by the BPF 92. After the under-sampling, a second-order aliased or folded signal component (a mirror component of the target signal and a non-inverted component) which appears in a first Nyquist zone (0-50 MHz) is observed.

As described above, in the present embodiment, when the frequency of the observation nucleus falls within the low frequency band, the direct generation scheme; that is, the non-conversion scheme, is selected, and in this case, the input side SW 82 and the output side SW 84 select the bypass route 86. In other words, in this case, the mixer 90 and the BPF 92 do not function. In this case, the output signal of the frequency converter circuit is not the intermediate frequency signal, and is in fact the RF reception signal.

On the other hand, when the frequency of the observation nucleus falls within the high frequency band, the frequency conversion scheme is selected, and in this case, the input side SW 82 and the output side SW 84 select the frequency conversion route 88. In this case, the mixer 90 and the BPF 92 function. In the mixer 90, the RF reception signal is mixed with the local signal 68B, and the mixed signal passes through the BPF 92 and becomes the intermediate frequency signal 93. The transmission side frequency converter circuit and the reception side frequency converter circuit operate in a cooperating manner. In other words, the frequency converter circuits select the same scheme. Alternatively, a configuration may be considered in which separate schemes are selected in the frequency converter circuits. Alternatively, the frequency converter circuit may be provided only on one of the transmission side and the reception side. In the present embodiment, the scheme is selected according to the frequency of the observation nucleus, but alternatively, the scheme may be selected by the user or selected automatically according to other conditions.

With the selection of the bypass route; that is, in the non-conversion scheme, an advantage can be obtained in that the purity of the transmission signal and the reception signal (in particular, the reception signal) can be maintained. Specifically, when a signal passes through a circuit, the signal is inevitably affected by the characteristic or the like of the circuit. With such a structure, a problem may be caused in which the signal component is changed or other components are mixed. The mixer or the like may cause such a problem. In particular, maintaining the purity is important for the reception signal, and, especially, at a low frequency in which the sensitivity and precision of the NMR signal becomes problematic, maintenance of the purity is important. According to the present embodiment, when the RF frequency is low, the non-conversion scheme is selected, and the mixer or the like is bypassed at the transmission side and the reception side. Thus, an advantage can be obtained in that it becomes possible to avoid a problem that unnecessary signals or noise are mixed to the transmission signal and the reception signal due to the mixing or the signal process or the like of the high-frequency signal.

The signal processor circuit 94 includes circuits such as a fixed amplifier, a variable ATT, an LPF, a variable amplifier, or the like. These circuits are static circuits. So long as the quality of the reception signal can be maintained, dynamic circuits may alternatively be employed.

An ADC (A/D converter) 96 is a circuit which converts an analog reception signal 95 which is input (RF reception signal or intermediate frequency signal) into a digital reception signal 97. A sampling frequency of the ADC 96 is, for example, 100 MHz in the present embodiment. In the present embodiment, when the frequency of the observation nucleus falls within a low frequency band of greater than or equal to 5 MHz and less than 50 MHz, the sampling scheme of the ADC 96 becomes over-sampling. In other words, according to Nyquist's theorem, the sampling becomes a sampling with respect to a signal having a frequency of less than ½ of 100 MHz (50 MHz).

On the other hand, when the frequency of the observation nucleus falls within a high frequency band of greater than or equal to 50 MHz and less than or equal to 1000 MHz, the sampling scheme of the ADC 96 becomes under-sampling. That is, with the action of the mixer 90, the frequency of the RF reception signal is fixedly converted to the intermediate frequency of 125 MHz. The intermediate frequency signal is sampled at 100 MHz. Assuming this process, an aliased signal component which is folded from the third Nyquist zone through the second Nyquist zone to the first Nyquist zone (second-order folded signal component) is set as the observation target. In this case also, because the unnecessary noise is reduced in advance with the action of the BPF 92 described above, reduction in S/N ratio is prevented. In the first Nyquist zone, a spectrum appears similar to that of the third Nyquist zone. Therefore, by observing the signal existing in the third Nyquist zone via the first Nyquist zone, a spectrum inversion process or the like becomes unnecessary, and an advantage can be obtained that the signal analysis can be easily executed.

In the present embodiment, the intermediate frequency is 125 MHz, and, in principle, for the sampling, a sampling frequency of greater than or equal to 250 MHz, desirably, greater than or equal to 300 MHz, for example, is necessary (in this case, the sampling becomes over-sampling). An ADC which can execute such a high-speed sampling, and in particular, which has a high data resolution (for example, greater than or equal to 16 bits and greater than or equal to 200 Msps) is relatively expensive, and in many cases, it is difficult to obtain or use such an ADC. According to the present embodiment, the under-sampling scheme may be applied for the intermediate frequency signal, and, in addition, the BPF is effectively utilized. Thus, a superior measurement precision can be achieved while using an ADC which is relatively inexpensive and which has a superior resolution.

The quadrature detection circuit is provided downstream of the ADC 96, and includes two mixers 98 and 100 provided in parallel to each other. The mixers 98 and 100 multiply a pair of reference signals 99 generated by a reference signal generator circuit 102; more specifically, a cos signal 99A and a sin signal 99B, by the digital reception signal 97. With this process, the reception signal is converted into a complex signal 101 of an audio frequency band. The complex signal 101 is made of a real part signal 101A and an imaginary part signal 101B.

The reference signal generator circuit 102 in the present embodiment has two reception NCOs that generate a pair of reference signals. The reception NCOs have the same structure as each other. Further, as the reception NCO, apparatuses similar to the transmission NCO for generating the transmission signal are used. Thus, the reception NCO has an arbitrary frequency generation function, a frequency modulation function, and a phase modulation function. When the reception signal to be processed is an intermediate frequency signal, a pair of reference signals having a certain frequency (for example, 25 MHz) for converting the intermediate frequency signal into a baseband signal are generated. When the reception signal is an RF reception signal, a pair of reference signals having a frequency (for example, less than 50 MHz as described above) for converting the RF reception signal into a baseband signal are generated.

In the present embodiment, operations of the two reception NCOs are controlled by a reception sequencer. Therefore, it is possible to dynamically change the parameter supplied to each of the reception NCOs during the measurement, to dynamically switch the phase modulation condition and the frequency modulation condition. Alternatively, the frequency of the reference signal may be dynamically changed. As described, in the present embodiment, a highly-functional quadrature detection circuit is realized. With such a configuration, a high-degree measurement satisfying various needs, and a signal process having a high degree of freedom can be realized.

Two digital filter circuits 104 and 106 are provided downstream of the quadrature detection circuit. These circuits are static circuits, and have a function to remove unnecessary signal components generated by the mixing process and a function to reduce a number of data points before the FFT calculation to convert the sampling rate (decimation). Each of the digital filter circuits 104 and 106 is formed by, for example, a CIC decimation circuit. Reception signals 108 after a predetermined process is applied; that is, a real part signal 108A and an imaginary part signal 108B, are stored in the reception data memory as reception data. Later, processes such as the frequency analysis are executed for reception data which are read from the reception data memory.

The sequencers 26 and 28, the transmission signal generator 30, and the reception signal processor 34 shown in FIG. 1 can be realized by a device such as an FPGA.

(4) Adaptive Selection of Operation Condition according to Frequency of Observation Nucleus FIG. 4 summarizes two operation conditions selected according to the frequency of the observation nucleus. Reference numeral 110 shows a frequency (RF) of the observation nucleus, reference numeral 112 shows a transmission signal (original signal) and a reception signal as a target of sampling, reference numeral 114 shows the content of a route selection at the transmission side, reference numeral 116 shows the content of a route selection at the reception side, and reference numeral 118 shows a sampling scheme. Reference numeral 120 shows a case where the frequency of the observation nucleus is greater than or equal to 5 MHz and less than 50 MHz; that is, a case where the frequency falls within the low frequency band, and reference numeral 122 shows a case where the frequency of the observation nucleus is greater than or equal to 50 MHz and less than or equal to 1000 MHz; that is, a case where the frequency falls within the high frequency band.

As shown in FIG. 4, when the frequency of the observation nucleus falls within the low frequency band (refer to reference numeral 120), the direct generation scheme (non-conversion scheme) is applied. More specifically, the generated transmission signal is an RF transmission signal rather than an intermediate frequency signal, the bypass route is selected at the transmission side, and the bypass route is selected also at the reception side. Further, the sampling scheme is over-sampling. In this case, the signal to be sampled is the RF reception signal.

On the other hand, when the frequency of the observation nucleus falls within the high frequency band (refer to reference numeral 122), the frequency conversion scheme is applied. More specifically, the generated transmission signal is an intermediate frequency signal rather than an RF transmission signal, the frequency conversion route is selected at the transmission side, and the frequency conversion route is selected also at the reception side. Further, the sampling scheme is under-sampling. The signal to be sampled is the intermediate frequency signal (IF signal).

Alternatively, the lower limit of the low frequency band may be set to a frequency lower than 5 MHz (for example, 1 MHz) or a frequency greater than 5 MHz (for example, 10 MHz). Similarly, the upper limit of the high frequency band may be set to a frequency higher than 1000 MHz (for example, 1500 MHz) or a frequency lower than 1000 MHz (for example, 500 MHz). In the above-described example configuration, a boundary frequency for dividing the two frequency bands is 50 MHz, but the boundary frequency may alternatively be set to a lower frequency. A suitable boundary frequency is desirably determined based on the sampling frequency. Alternatively, a configuration may be employed in which parts of the two frequency bands overlap, and the operation condition can be selected for the overlapped parts. Alternatively, a frequency band which cannot be selected may exist between the two frequency bands.

(5) Detailed Description of Under-Sampling

Figure 5:
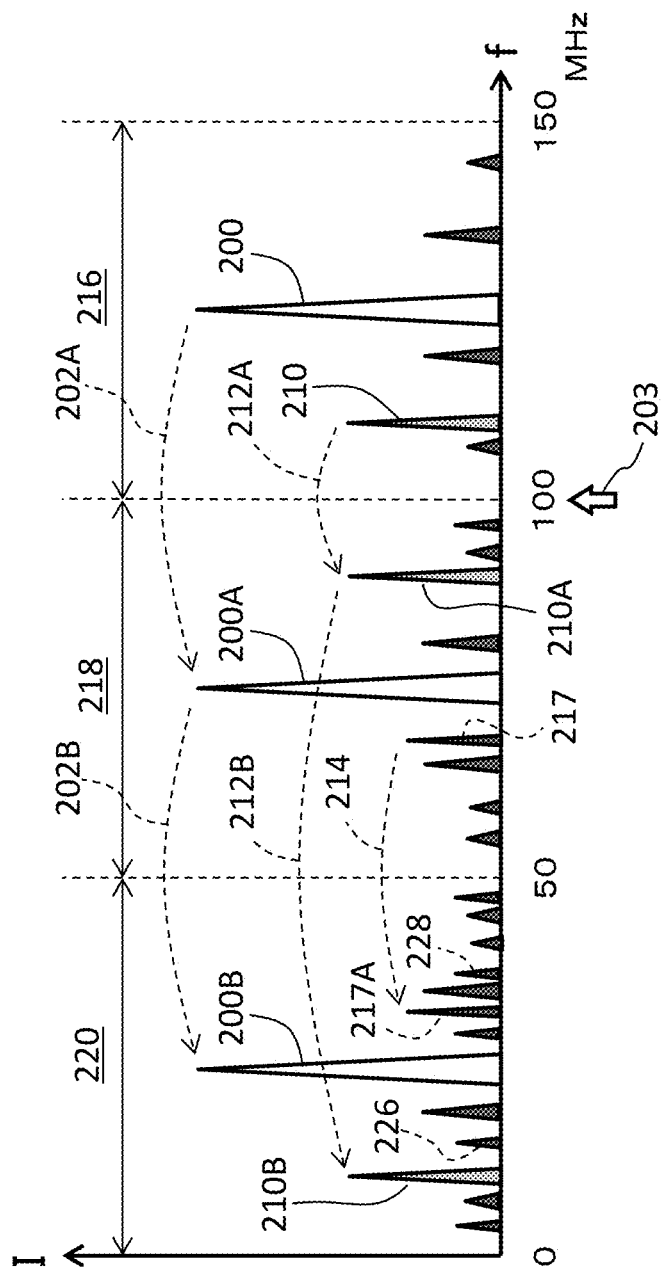
FIG. 5 is a diagram showing a signal distribution (before applying a filter) from a first Nyquist zone to a third Nyquist zone.

FIG. 5 shows a signal distribution on a frequency axis f. The signal distribution is a distribution before the filter (BPF 92 of FIG. 3) is applied. A target signal component serving as an intermediate frequency signal is shown with reference numeral 200. The frequency of the intermediate frequency signal is 125 MHz in the example configuration. The sampling frequency in the example configuration is 100 MHz (refer to reference numeral 203). With the sampling frequency, a plurality of zones are defined. Specifically, a third Nyquist zone 216, a second Nyquist zone 218, and a first Nyquist zone 220 are determined. Each zone in the exemplified configuration is a frequency section of 50 MHz. The target signal component 200 falls within the third Nyquist zone. An aliased signal component of a first time of the target signal component is a mirror component 200A in the second Nyquist zone 218. The first aliasing is shown with reference numeral 202A. An aliased signal component of a second time of the target signal component is a mirror component 200B appearing in the first Nyquist zone 220. The second aliasing is shown with reference numeral 202B.

A noise 210 existing in the third Nyquist zone 216 appears in the second Nyquist zone 218 as a mirror component 210A, as shown by reference numeral 212A, and appears in the first Nyquist zone 220 as a mirror component 210B, as shown by reference numeral 212B. A noise 217 generated in the second Nyquist zone appears in the first Nyquist zone 220 as a mirror component 217A, as shown by reference numeral 214. In addition, noises 226 and 228 existing in the first Nyquist zone 220 from the beginning also appear in the first Nyquist zone 220.

Therefore, a large number of noises exist in the first Nyquist zone, and, if the mirror component 200B which is a second-order aliased signal component of the target signal component 200 is observed there, the S/N ratio would be inferior. In consideration of this, in the present embodiment, prior to the under-sampling for the intermediate frequency signal, a filter process (BPF 92 in FIG. 3) is applied to the intermediate frequency signal, to suppress the signal component belonging to regions other than the third Nyquist zone 216.

Figure 6:
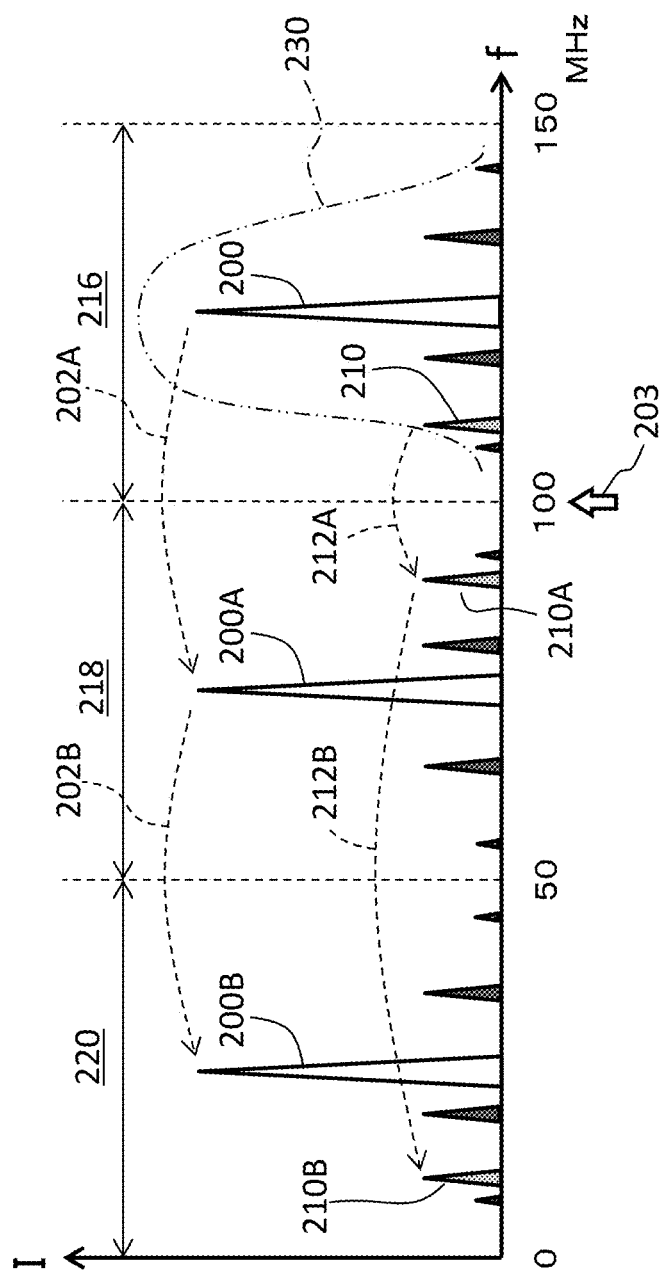
FIG. 6 is a diagram showing a signal distribution (after a filter is applied) from a first Nyquist zone to a third Nyquist zone.

FIG. 6 shows a spectrum after the filter process is applied. In FIG. 6, elements similar to those shown in FIG. 5 are assigned the same reference numerals as in FIG. 5. Reference numeral 230 shows a passing band characteristic of the BPF. The, filter suppresses the signal component existing in regions other than the third Nyquist zone 216, and, at the same time, suppresses the unnecessary signal components other than the components near the target signal component 200 within the third Nyquist zone 216 as necessary. A center frequency of the passing band characteristic 230 is made coincident with the center frequency of the target signal component 200. Alternatively, the passing band width may be set variable. In this case, a filter bank or the like as a collective structure of a plurality of filters may be used.

As shown in FIG. 6, with the action of the filter, the noise existing in the second Nyquist zone 218 from the beginning is significantly suppressed, and the noise existing in the first Nyquist zone 220 from the beginning is also significantly suppressed. As a result, the mirror components thereof are significantly suppressed in the first Nyquist zone 220. With regard to the noise existing in the third Nyquist zone 216 from the beginning, a mirror component thereof appears in the first Nyquist zone 220, but it is also possible to effectively suppress such a noise by adjusting the band of the BPF.

As described, by applying the under-sampling on the intermediate frequency signal assuming the filter process, it is possible to improve the signal processing precision. In the present embodiment, because the second-order aliased signal component is observed, a process for inverting the signal distribution in the zone or the like becomes unnecessary. In addition, because the number of orders of the aliasing is small, there is an advantage that signal degradation due to aliasing can be reduced.

In the present embodiment, when the frequency of the observation nucleus is in the low frequency band; that is, greater than or equal to 5 MHz and less than 50 MHz, the non-conversion scheme is applied and the RF reception signal is directly sampled. All of the low frequency band is contained in the first Nyquist zone 220. Therefore, the second-order aliased signal component of the intermediate frequency signal when the frequency conversion scheme is applied and the RF reception signal when the non-conversion scheme is applied can be processed under the same conditions. In other words, the sampling scheme can be switched by merely manipulating the frequency to be observed at the upstream side of the sampling circuit.

In summary, in the present embodiment, 50 MHz, which is ½ the sampling frequency of 100 MHz, is the reference frequency. When the frequency of the observation nucleus is greater than or equal to the reference frequency, the under-sampling scheme is applied. When the frequency of the observation nucleus is less than the reference frequency, the over-sampling scheme is applied. Alternatively, in place of switching depending on the presence/absence of the frequency conversion, the sampling scheme may be switched based on other conditions. As an alternative configuration, a configuration may be considered in which the sampling scheme is selected by the user. In another alternative configuration, the sampling condition may be changed at the switching of the sampling scheme.

The invention claimed is:

1. A magnetic resonance measurement apparatus comprising:
an analog-to-digital converter circuit to which an analog reception signal including a target signal component having a first frequency is input, that samples the analog reception signal at a sampling frequency which is a second frequency, and that outputs a digital reception signal; and
a signal processor circuit that executes a signal processing on the digital reception signal, wherein when the first frequency satisfies an over-sampling condition, a sampling scheme of the analog-to-digital converter circuit is an over-sampling scheme, and the signal processor circuit executes the signal processing on the target signal component, and when the first frequency satisfies an under-sampling condition, the sampling scheme of the analog-to-digital converter circuit is an under-sampling scheme, and the signal processor circuit executes the signal processing on an aliased signal component generated from the target signal component, and wherein a frequency converter circuit is provided upstream of the analog-to-digital converter circuit, the frequency converter circuit converts a radio frequency (RF) reception signal into an intermediate frequency signal when a frequency determined according to an observation nucleus falls within a high frequency band, and does not convert the RF reception signal into the intermediate frequency signal and outputs the RF reception signal when the frequency determined according to the observation nucleus falls within a low frequency band which is lower than the high frequency band, the RF reception signal or the intermediate frequency signal is input to the analog-to-digital converter circuit as the analog reception signal, the first frequency satisfies the over-sampling condition when the first frequency is the frequency determined according to the observation nucleus and the RF reception signal is input to the analog-to-digital converter circuit, and the first frequency satisfies the under-sampling condition when the first frequency is an intermediate frequency and the intermediate frequency signal is input to the analog-to-digital converter circuit.

2. The magnetic resonance measurement apparatus according to claim 1, wherein the frequency converter circuit comprises:

a mixer that mixes a local signal to the RF reception signal; and a filter provided downstream of the mixer, and that suppresses a signal component, in an output signal of the mixer, existing in a band other than the band within which the intermediate frequency falls, and the intermediate frequency signal is output from the filter.

3. The magnetic resonance measurement apparatus according to claim 1, wherein the first frequency satisfies the over-sampling condition when the first frequency is lower than a reference frequency which is less than or equal to ½ of the second frequency, and the first frequency satisfies the under-sampling condition when the first frequency is greater than or equal to the reference frequency.

4. The magnetic resonance measurement apparatus according to claim 1, wherein when the first frequency satisfies the under-sampling condition, the signal processor circuit executes the signal processing on a second-order aliased signal component generated from the target signal component.

5. A method of processing a nuclear magnetic resonance (NMR) reception signal, comprising:

outputting a radio frequency (RF) reception signal from an NMR probe without converting the RF reception signal into an intermediate frequency signal when an observation frequency falls within a low frequency band, and converting the RF reception signal from the NMR probe into the intermediate frequency signal and outputting the converted signal when the observation frequency falls within a high frequency band which is higher than the low frequency band; and executing sampling on the RF reception signal and the intermediate frequency signal, wherein a sampling scheme for the RF reception signal is set to an over-sampling scheme when the observation frequency falls within the low frequency band and a sampling scheme for the intermediate frequency signal is set to an under-sampling scheme when the observation frequency falls within the high frequency band, wherein the observation frequency is a frequency corresponding to a magnetic resonance frequency of an observation nucleus.

6. The method according to claim 5, further comprising:

executing a frequency analysis based on the sampled signal wherein the frequency analysis is executed on a second-order aliased signal component generated from a target signal component included in the RF reception signal when the observation frequency falls within the high frequency band.

7. The method according to claim 5, wherein a sampling frequency at over-sampling for the RF reception signal and a sampling frequency at under-sampling for the intermediate frequency signal are the same.

* * * * *